(12) United States Patent
Moon et al.

(10) Patent No.: US 12,136,842 B2
(45) Date of Patent: Nov. 5, 2024

(54) POWER RECEIVING DEVICE AND METHOD FOR CONTROLLING A CHARGING CURRENT

(71) Applicant: Samsung Electronics Co., Ltd., Gyeonggi-do (KR)

(72) Inventors: Hasik Moon, Gyeonggi-do (KR); Seungho Lee, Gyeonggi-do (KR); Kyungik Jang, Gyeonggi-do (KR); Doosuk Kang, Gyeonggi-do (KR); Sungjin Kim, Gyeonggi-do (KR); Sangkyung Park, Gyeonggi-do (KR); Byoungchul Lee, Gyeonggi-do (KR); Hongsup Lee, Gyeonggi-do (KR); Jungho Cho, Gyeonggi-do (KR); Bokun Choi, Gyeonggi-do (KR); Chijeong Choi, Gyeonggi-do (KR); Donghoon Hyun, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 315 days.

(21) Appl. No.: 17/159,373

(22) Filed: Jan. 27, 2021

(65) Prior Publication Data
US 2021/0249886 A1 Aug. 12, 2021

(30) Foreign Application Priority Data
Feb. 10, 2020 (KR) .......................... 10-2020-0015983

(51) Int. Cl.
*G01R 19/165* (2006.01)
*H01M 10/42* (2006.01)
(Continued)

(52) U.S. Cl.
CPC .. *H02J 7/007182* (2020.01); *G01R 19/16542* (2013.01); *H01M 10/425* (2013.01);
(Continued)

(58) Field of Classification Search
CPC ............ H02J 7/007182; H02J 7/00034; H02J 7/0049; H02J 7/0014; H02J 7/0045;
(Continued)

(56) References Cited

U.S. PATENT DOCUMENTS

| 10,042,595 B2 | 8/2018 | Behzadi et al. |
| 10,219,062 B2 | 2/2019 | Watson et al. |

(Continued)

OTHER PUBLICATIONS

International Search Report dated May 20, 2021.

*Primary Examiner* — Drew A Dunn
*Assistant Examiner* — Pamela J Jeppson
(74) *Attorney, Agent, or Firm* — Cha & Reiter, LLC

(57) ABSTRACT

An embodiment of the disclosure provides a first power receiving device including a battery, a power management integrated circuit, an interface for receiving power from a power supply device, and a processor configured to control a charging current using the power management integrated circuit. The processor may be configured to: if charging from the power supply device through the interface is detected, set the charging current, transmit first charging information associated with the first power receiving device to the power supply device, through the interface, receive second charging information associated with a second power receiving device which is paired with the first power receiving device or associated with the power supply device from the power supply device, through the interface, and control the charging current by comparing the first charging information and the second charging information.

15 Claims, 9 Drawing Sheets

(51) Int. Cl.
  *H01M 10/44* (2006.01)
  *H02J 7/00* (2006.01)
  *H04R 1/10* (2006.01)

(52) U.S. Cl.
  CPC ....... *H01M 10/441* (2013.01); *H01M 10/443* (2013.01); *H02J 7/00034* (2020.01); *H02J 7/0014* (2013.01); *H02J 7/0045* (2013.01); *H02J 7/0049* (2020.01); *H04R 1/1016* (2013.01); *H04R 1/1025* (2013.01); *H01M 2010/4271* (2013.01); *H04R 2420/07* (2013.01)

(58) Field of Classification Search
  CPC .......... G01R 19/16542; H01M 10/425; H01M 10/441; H01M 10/443; H01M 2010/4271; H04R 1/1016; H04R 1/1025; H04R 2420/07
  See application file for complete search history.

(56) References Cited

U.S. PATENT DOCUMENTS

| | | |
|---|---|---|
| 2009/0309544 A1 | 12/2009 | Studyvin et al. |
| 2010/0066303 A1 | 3/2010 | Lam et al. |
| 2010/0253278 A1* | 10/2010 | Chang ............... B60L 53/51 320/101 |
| 2012/0056584 A1* | 3/2012 | Mariels ............... H02J 7/0016 320/112 |
| 2013/0207599 A1* | 8/2013 | Ziv ...................... H02J 50/80 320/108 |
| 2014/0082384 A1 | 3/2014 | De Cesare et al. |
| 2016/0219358 A1* | 7/2016 | Shaffer ............... H04R 1/1016 |
| 2017/0245039 A1* | 8/2017 | Chen ................... H01M 10/44 |
| 2017/0339482 A1* | 11/2017 | Schrems .............. H02J 50/10 |
| 2018/0164867 A1 | 6/2018 | Zhang et al. |
| 2019/0200113 A1* | 6/2019 | Kim ..................... H02J 7/342 |
| 2019/0379216 A1* | 12/2019 | Yoon ................... H04R 1/1025 |
| 2020/0076203 A1* | 3/2020 | Badstue .............. H02J 50/10 |

* cited by examiner

POWER RECEIVING DEVICE AND METHOD FOR CONTROLLING A CHARGING CURRENT

CROSS-REFERENCE TO RELATED APPLICATION(S)

This application is based on and claims priority under 35 U.S.C. § 119 to Korean Patent Application No. 10-2020-0015983, filed on Feb. 10, 2020, in the Korean Intellectual Property Office, the disclosure of which is incorporated by reference herein in its entirety.

TECHNICAL FIELD

One or more embodiments of the instant disclosure relate generally to a power receiving device, and more particularly, relates to a power receiving device and a method for controlling charging current based on a state of the paired power receiving device.

BACKGROUND

Bluetooth earphones allow for phone calls and music playback, which are done by Bluetooth pairing with an electronic device (e.g., smart phone or personal computer (PC)). Users increasingly are using Bluetooth earphones, which have numerous advantages over conventional wired earphones such as lack of physical wires which improves user convenience.

Early Bluetooth earphones mostly were mono earphones which are worn over a single ear or neckband earphones in which the two earphones are connected by a connection portion or wire which is worn around the back of a user's neck. Recently, the most popular earphone type is one that is "truly wireless," that is, even the connection wire between the earphones is removed.

Truly wireless Bluetooth earphones have no lines or wires for connecting the electronic device and the earphones or between the earphones, and accordingly the user may freely move without having to worry about tangling wires. Truly wireless Bluetooth earphones each includes a separate battery, which may be repeatedly charged.

However, the size of the earphone including the battery should be minimized so as to not cause discomfort when the earphones are worn for a long time. This has been balanced with battery life, as battery capacity decreases as the earphone size reduces. Truly wireless Bluetooth earphones are thus subject to low efficiency due to short battery life. To make up for the short battery life, truly wireless Bluetooth earphones may provide a separate charging case for supplying power when the earphones are seated in the case.

SUMMARY

Truly wireless Bluetooth earphones generally operate in pairs, but power drain of each earphone unit may be different depending on various use cases. For example, if the user uses only one earphone unit of the paired earphones, the battery of the used earphone may drain faster than that of the other earphone. In another example, one of the earphone units may be the primary device that performs the main role of Bluetooth communication with the paired terminal and accordingly may consume more power than the other earphone unit.

If earphone units of different remaining battery capacities are mounted in the charging case, the charging case supplies power with the same voltage for each earphone unit. That is, the earphone units of the different remaining battery capacities may be fully charged at different times. For example, if the battery of the right earphone is 60% charged and the battery of the left earphone is 35% charged, when the battery of the right earphone is 100% charged, the battery of the left earphone may be charged merely to 80%. The earphone not fully charged may require additional charging. This may cause inconvenience to the user, because he or she may have to wait an extra period of time for both earphones to be fully charged, even though during this extra period one of the earphones is 100% charged and is ready for use.

A first power receiving device according to an embodiment, may include a housing, a battery disposed in the housing, a power management integrated circuit operatively connected with the battery, an interface for receiving power from a power supply device, and a processor electrically connected with the battery, the power management integrated circuit and the interface, and configured to control a charging current using the power management integrated circuit. The processor may be further configured to: if charging from the power supply device through the interface is detected, set the charging current, transmit first charging information associated with the first power receiving device to the power supply device, through the interface, receive second charging information associated with a second power receiving device which is paired with the first power receiving device or associated with the power supply device from the power supply device, through the interface, and control the charging current by comparing the first charging information and the second charging information.

An operating method of a first power receiving device according to an embodiment, may include, when charging from a power supply device through an interface is detected, setting a charging current using a power management integrated circuit, transmitting first charging information associated with the first power receiving device to the power supply device through the interface, receiving second charging information associated with a second power receiving device which is paired with the first power receiving device or associated with the power supply device from the power supply device through the interface, and controlling the charging current through the power management integrated circuit by comparing the first charging information and the second charging information.

A power supply device according to an embodiment, may include a first receiver for receiving a first power receiving device and a second receiver for receiving a second power receiving device which is paired with the first power receiving device, a first interface electrically connected with the first power receiving device, and mounted in the first receiver, a second interface electrically connected with the second power receiving device, and mounted in the second receiver, a battery, and a processor electrically connected with the first interface, the second interface and the battery. The processor may be configured to receive first charging information associated with the first power receiving device mounted in the first receiver through the first interface, receive second charging information associated with the second power receiving device mounted in the second receiver through the second interface, transmit the second charging information to the first power receiving device through the first interface, and transmit the first charging information to the second power receiving device through the second interface.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components and structures.

DETAILED DESCRIPTION

According to certain embodiments of the disclosure, a power receiving device may receive, from a power supply device, battery information of another power receiving device which is paired, and control charging current based on the received information.

Figure 1:
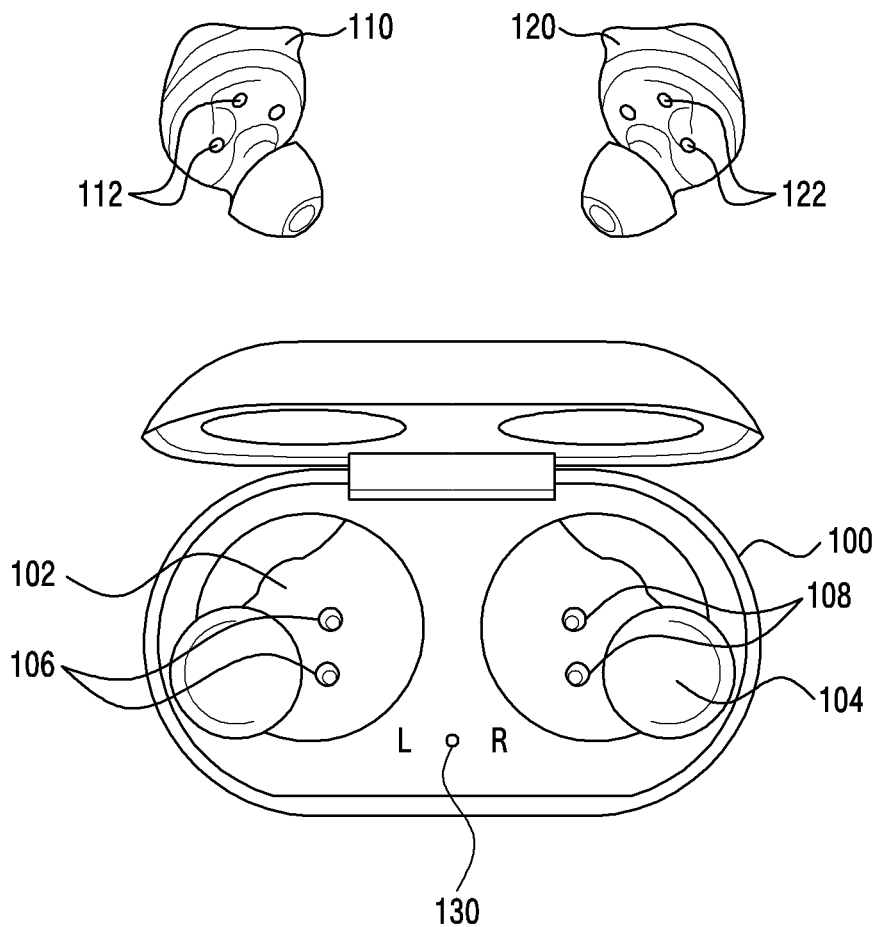
FIG. 1 illustrates a power supply device and a power receiving device according to an embodiment.

FIG. 1 illustrates a power supply device and a power receiving device according to an embodiment.

Referring to FIG. 1, a power supply device 100 may include a first receiver 102 for receiving a first power receiving device 110 and a second receiver 104 for receiving a second power receiving device 120. In an embodiment, a first interface 106 including at least one port may be disposed on a lower surface of the first receiver 102, and a second interface 108 including at least one port may be disposed on a lower surface of the second receiver 104.

In an embodiment, the first interface 106 and the second interface 108 each may include a pogo pin. In an embodiment, the first interface 106 and the second interface 108 may include at least one of a charging power port, a ground (GND) port, a detect port or a data communication port. In another embodiment, at least one port of the first interface 106 and the second interface 108 may perform two or more functions of the charging power port, the detect port and the data communication port. For example, one port of the first interface 106 may detect that the first power receiving device 110 is mounted in the first receiver 102, charge the first power receiving device 110, and communicate data with the first power receiving device 110. Similarly, one port of the second interface 108 may detect that the second power receiving device 120 is mounted in the second receiver 104, charge the second power receiving device 120, and communicate data with the second power receiving device 120.

In an embodiment, the power supply device 100 may include at least one light emitting diode (LED) light 130. In an embodiment, the LED light 130 may output a signal if the first power receiving device 110 or the second power receiving device 120 is mounted in at least one of the first receiver 102 or the second receiver 104. For example, if the first power receiving device 110 is mounted in the first receiver 102, the LED light 130 may output the signal (e.g., green light or red light) indicating a charging state (e.g., full charging or charging) of the first power receiving device 110.

In an embodiment, the first power receiving device 110 may receive power from the power supply device 100 through the first interface 112. In an embodiment, the second power receiving device 120 may receive power from the power supply device 100 through the second interface 122. In an embodiment, the first power receiving device 110 may transmit data to the power supply device 100 through the first interface 112, and the second power receiving device 120 may transmit data to the power supply device 100 through the second interface 122. For example, the first power receiving device 110 may transmit information including its remaining battery capacity information to the power supply device 100. In an embodiment, the first power receiving device 110 may receive data from the power supply device 100 through the first interface 112, and the second power receiving device 120 may receive data from the power supply device 100 through the second interface 122. For example, the first power receiving device 110 may receive information including the remaining battery capacity information of the second power receiving device 120 and/or remaining battery capacity information of the power supply device 100 from the power supply device 100. Similarly, the second power receiving device 120 may receive information including the remaining battery capacity information of the first power receiving device 110 and/or the remaining battery capacity information of the power supply device 100 from the power supply device 100.

Figure 2:
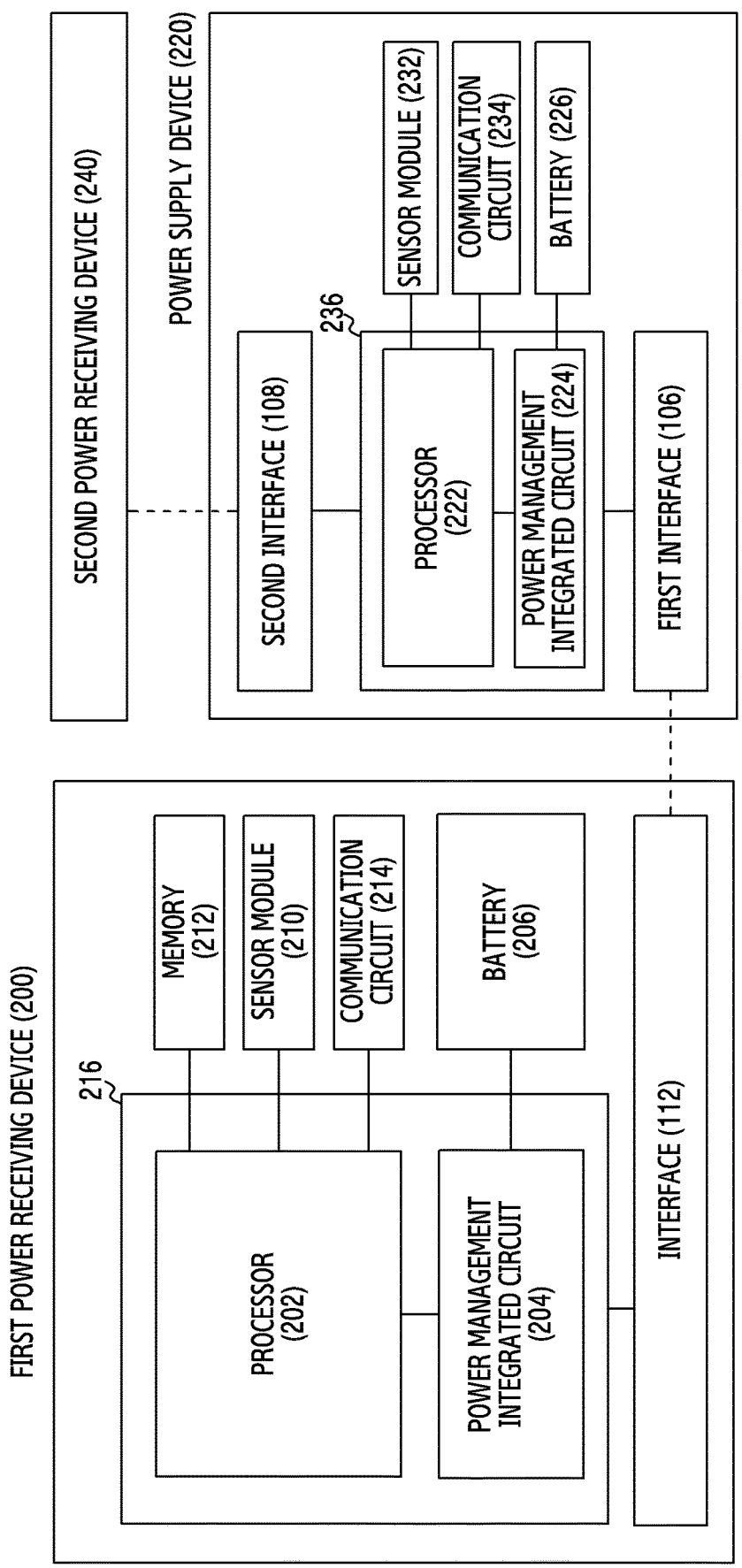
FIG. 2 illustrates a block diagram of a power supply device and a power receiving device according to an embodiment.

FIG. 2 illustrates a block diagram of a power supply device and a power receiving device according to an embodiment.

Referring to FIG. 2, a first power receiving device 200 may include a power management module 216, a battery 206, an interface 112, a sensor module 210, a memory 212 and a communication circuit 214. The first power receiving device 200 of FIG. 2 may correspond to the first power receiving device 110 of FIG. 1, and a second power receiving device 240 may correspond to the second power receiving device 120 of FIG. 1. Hence, the same or similar explanations corresponding to FIG. 1 shall be omitted.

In an embodiment, the battery 206 may supply power to at least one component of the first power receiving device 200. In an embodiment, the battery 206 may include a rechargeable secondary cell. In an embodiment, the remaining battery capacity of the first power receiving device 200 and the remaining battery capacity of the second power receiving device 240 may be different from each other. For example, the remaining battery capacity of the first power receiving device 200 may correspond to 35%, and the remaining battery capacity of the second power receiving device 240 may correspond to 50%.

In an embodiment, the power management module 216 may include a processor 202 and a power management integrated circuit (PMIC) 204. In an embodiment, the PMIC 204 may control charging of the first power receiving device 200. For example, the PMIC 204 may detect an external power supply (e.g., a power supply device 220) and charge the battery 206. In an embodiment, the PMIC 204 may change a charging current based on a charging current value received from the processor 202. In an embodiment, the processor 202 may determine the charging current value regardless of the voltage value of the battery 206. For example, by receiving charging information (e.g., whether the second power receiving device 240 is mounted in the power supply device 220, remaining battery capacity information of the second power receiving device 240, temperature information, battery voltage range information (or a battery voltage value) or battery full charging information (i.e. information indicating that the battery is full)) from the power supply device 220, the processor 202 may determine the charging current value corresponding to the charging information. The processor 202 may generate a data signal including the determined charging current value. The processor 202 may transmit the generated data signal to the PMIC 204. The PMIC 204 receiving the data signal from the processor 202 may change from an initial charging current which is set based on the voltage of the battery 206 to the charging current based on the data signal. In an embodiment, the first power receiving device 200 may receive the power according to the battery voltage of the power supply device 220 from the power supply device 220 through the interface 112. In an embodiment, the first power receiving device 200 may receive charging information of the second power receiving device 240 and/or of the power supply device 220 from the power supply device 220 through the interface 112. For example, the first power receiving device 200 may receive charging information including at least one of whether the second power receiving device 240 is mounted, the remaining battery capacity information and the temperature information from the power supply device 220 through the interface 112. In another example, the first power receiving device 200 may receive charging information including at least one of the remaining battery capacity and the charging state (e.g., wired charging, wireless charging, fast charging or not charging) of the power supply device 220 from the power supply device 220 through the interface 112. The processor 202 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. § 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

In an embodiment, the sensor module 210 may include a wearing detection sensor for detecting user's wearing. For example, the sensor module 210 may detect that the user wears the first power receiving device 200, and output a signal or a data value corresponding to the wearing state. The wearing detection sensor may be implemented with a proximity sensor.

In an embodiment, the memory 212 may store various data used by at least one component (e.g., the processor 202 or the sensor module 210) of the first power receiving device 200. For example, the memory 212 may store range values of a voltage range of the battery 206. In another example, the memory 212 may store preset charging current values for differences of the battery voltage range values between the first power receiving device 200 and the second power receiving device 240.

In an embodiment, the communication circuit 214 may support establishment of a direct wireless communication channel between the first power receiving device 200 and an external electronic device (e.g., server, smartphone, personal computer (PC) or access point) and communication over the established communication channel. In an embodiment, the communication circuit 214 may include one or more communication processors which are operated independently of the processor 202 and support the direct wireless communication. For example, the first power receiving device 200 may perform short-range communication by transceiving data with a terminal in a specific range (e.g., 15 m) through the communication circuit 214. The first power receiving device 200 may transmit its remaining battery capacity information to the terminal through the communication circuit 214. In an embodiment, if receiving the remaining battery capacity information of the first power receiving device 200 and the second power receiving device 240, the terminal may display the remaining battery capacity information on a display. In an embodiment, the terminal may adjust and display the remaining battery capacity information of the first power receiving device 200 and the second power receiving device 240. For example, if the remaining battery capacity of the first power receiving device 200 corresponds to 93%, the remaining battery capacity of the second power receiving device 240 corresponds to 95%, which means that the battery capacity difference between the two is small, the terminal may display both remaining battery capacities as 95%.

In an embodiment, the first power receiving device 200 may perform data synchronization with the second power receiving device 240 through the communication circuit 214. For example, if the first power receiving device 200 and the second power receiving device 240 are not mounted in the power supply device 220, the first power receiving device 200 may transmit its battery level information to the second power receiving device 240 through the communication circuit 214. The second power receiving device 240 including the same components as the first power receiving device 200 may transmit its battery level information to the first power receiving device 200 through the communication circuit (not shown). In another example, if the power supply device 220 receiving the first power receiving device 200 and the second power receiving device 240 is active (e.g., the case of the power supply device 220 is opened), the first power receiving device 2000 may transmit and receive the battery level information to and from the second power receiving device 240 through the communication circuit 214.

In an embodiment, the processor 202 may control the charging current based on the charging information of the second power receiving device 240 received from the power supply device 220. For example, the processor 202 may compare the remaining battery capacity in the charging information of the second power receiving device 240 with the remaining battery capacity of the first power receiving device 200, and accordingly control the PMIC 204 to change the charging current received from the power supply device 220.

In an embodiment, the power supply device 220 (e.g., the power supply device 100 of FIG. 1) may include a power management module 236 including a processor 222 and a PMIC 224, a battery 226, a first interface 106, a second interface 108, a sensor module 232 and a communication circuit 234.

In an embodiment, the PMIC 224 may control the charging of the power supply device 220. For example, the PMIC 224 may charge the battery 226 by using power supplied from an external power source device. For example, the power supply device 220 may include an external power interface (not shown) for receiving wireless or wired power supplied from the external power source device. In an embodiment, the PMIC 224 may control the charging of the first power receiving device 200 and the second power receiving device 240. For example, the PMIC 224 may charge the first power receiving device 200 and the second power receiving device 240 along with the charged battery 226. In another example, the PMIC 224 may receive the power supplied from the external power source device and charge the first power receiving device 200 and the second power receiving device 240 based at least in part on the power supplied from the external power source device.

In an embodiment, the battery 226 may supply the power to at least one of the first power receiving device 200 or the second power receiving device 240. In an embodiment, the battery 226 may include a rechargeable secondary cell.

In an embodiment, the power supply device 220 may receive the charging information of the first power receiving device 200 from the first power receiving device 200 through the first interface 106, and receive the charging information of the second power receiving device 240 from the second power receiving device 240 through the second interface 108. In an embodiment, the power supply device 220 may detect through the first interface 106 whether the first power receiving device 200 is mounted, and detect through the second interface 108 whether the second power receiving device 240 is mounted. For example, if at least one port of the first interface 106 performs the detect port function, the power supply device 220 may detect a resistance value change of the first interface 106 and detect whether the first power receiving device 200 is mounted. In an embodiment, the power supply device 220 may detect that the first power receiving device 200 is mounted, through the first interface 106, and receive the charging information of the first power receiving device 200 from the first power receiving device 200. In another embodiment, the power supply device 220 may detect that the first power receiving device 200 is mounted, through the first interface 106, request the charging information of the first power receiving device 200 from the first power receiving device 200, and receive the charging information of the first power receiving device 200 in response to the request.

In an embodiment, the power supply device 220 may communicate data with the terminal (e.g., a smart phone) and/or the power receiving device 200 and 240 through the communication circuit 234. For example, the power supply device 220 may perform short-range communication to transceive data with a terminal in a specific range (e.g., 15 m) through the communication circuit 234. The power supply device 220 may transmit the battery level information of the power supply device 220 and/or the battery level information of the power receiving device 200 and 240 mounted in the power supply device 220 to the terminal through the communication circuit 234.

In an embodiment, the sensor module 232 may include a sensor for detecting a user's input. For example, the sensor module 232 may detect the user's input and control a function (e.g., voice call, notification, or music playback) corresponding to the input.

In embodiment, the processor 222 may transmit the charging information of the first power receiving device 200 received from the first power receiving device 200 through the first interface 106, to the second power receiving device 240 through the second interface 108. In an embodiment, the processor 222 may transmit the charging information of the second power receiving device 240 received from the second power receiving device 240 through the first interface 106, to the first power receiving device 200 through the first interface 106. For example, if detecting the mounting of the first power receiving device 200 and the second power receiving device 240 substantially at the same time (e.g. within 5 seconds), the processor 222 may receive the remaining battery capacity information of 35% from the first power receiving device 200 through the first interface 106, and receive the remaining battery capacity information of 50% from the second power receiving device 240 through the second interface 108. The processor 222 may transmit information including the remaining battery capacity information 50% of the second power receiving device 240 to the first power receiving device 200 through the first interface 106. The processor 222 may transmit information including the remaining battery capacity information 35% of the first power receiving device 200 to the second power receiving device 240 through the second interface 108. Further, if mounting or removal of the second power receiving device 240 is detected, the processor 222 may transmit charging information including the detected mounting or removal of the second power receiving device 240 to the first power receiving device 200 through the first interface 106.

For example, if mounting of the first power receiving device 200 alone is detected, the processor 222 may receive the remaining battery capacity information 35% from the first power receiving device 200 through the first interface 106. The processor 222 may transmit charging information indicating no mounting of the second power receiving device 240 to the first power receiving device 200 through the first interface 106. If mounting of the second power receiving device 240 is detected, the processor 222 may transmit charging information indicating the detected mounting of the second power receiving device 240 to the first power receiving device 200 through the first interface 106.

In an embodiment, the second power receiving device 240 may include the same components and functionalities as the first power receiving device 200. Accordingly, descriptions of the second power receiving device 240 may correspond to the descriptions of the processor 202, the PMIC 204, the battery 206, the interface 112 and the sensor module 210 of the first power receiving device 200.

In an embodiment, a first power receiving device 200 may include a housing, a battery 206 disposed in the housing, a power management integrated circuit 204 operatively connected with the battery, an interface 112 for receiving power from a power supply device 220, and a processor 202 electrically connected with the battery, the power management integrated circuit and the interface, and configured to control a charging current using the power management integrated circuit. The processor may be further configured to: if charging from the power supply device through the interface is detected, set the charging current, transmit first charging information associated with the first power receiving device to the power supply device, through the interface, receive second charging information associated with the second power receiving device 240 which is paired with the first power receiving device or associated with the power supply device from the power supply device, through the interface, and control the charging current by comparing the first charging information and the second charging information.

In an embodiment, the processor may be configured to: if the charging from the power supply device is detected, set the charging current to a first charging current, in comparing the first charging information and the second charging information, if a remaining battery capacity of the first power receiving device is higher than or equal to a remaining battery capacity of the second power receiving device, change the charging current to a second charging current which is lower than the first charging current, and in comparing the first charging information and the second charging information, if the remaining battery capacity of the first power receiving device is lower than the remaining battery capacity of the second power receiving device, change the charging current to a third charging current which is higher than the first charging current.

In an embodiment, the processor may be configured to, if remaining battery capacity information of the second power receiving device is not received, set the charging current to a maximum charging current.

In an embodiment, the first charging information may include a first voltage value indicating a battery voltage of the first power receiving device, the second charging information may include a second voltage value indicating a battery voltage of the second power receiving device, and the processor may be configured to control the charging current based on the first voltage value and the second voltage value.

In an embodiment, the processor may be configured to obtain a first range value corresponding to the first voltage value among a plurality of voltage ranges related to the charging, obtain a second range value corresponding to the second voltage value among the plurality of the voltage ranges, and control the charging current based on a difference of the first range value and the second range value.

In an embodiment, the first charging information transmitted to the power supply device through the interface may include at least one of remaining battery capacity information, temperature information, a battery voltage, battery voltage range information and battery full charging information of the first power receiving device.

In an embodiment, the processor may be configured to, if a designated condition is satisfied, transmit the first charging information to the power supply device.

In an embodiment, the designated condition may include detecting electrical connection with the power supply device through the interface.

In an embodiment, the designated condition may include a change of a state of charge (SOC) value of the battery of the first power receiving device.

In an embodiment, the second charging information received from the power supply device through the interface may include at least one of remaining battery capacity information and SOC information of the power supply device.

Figure 3:
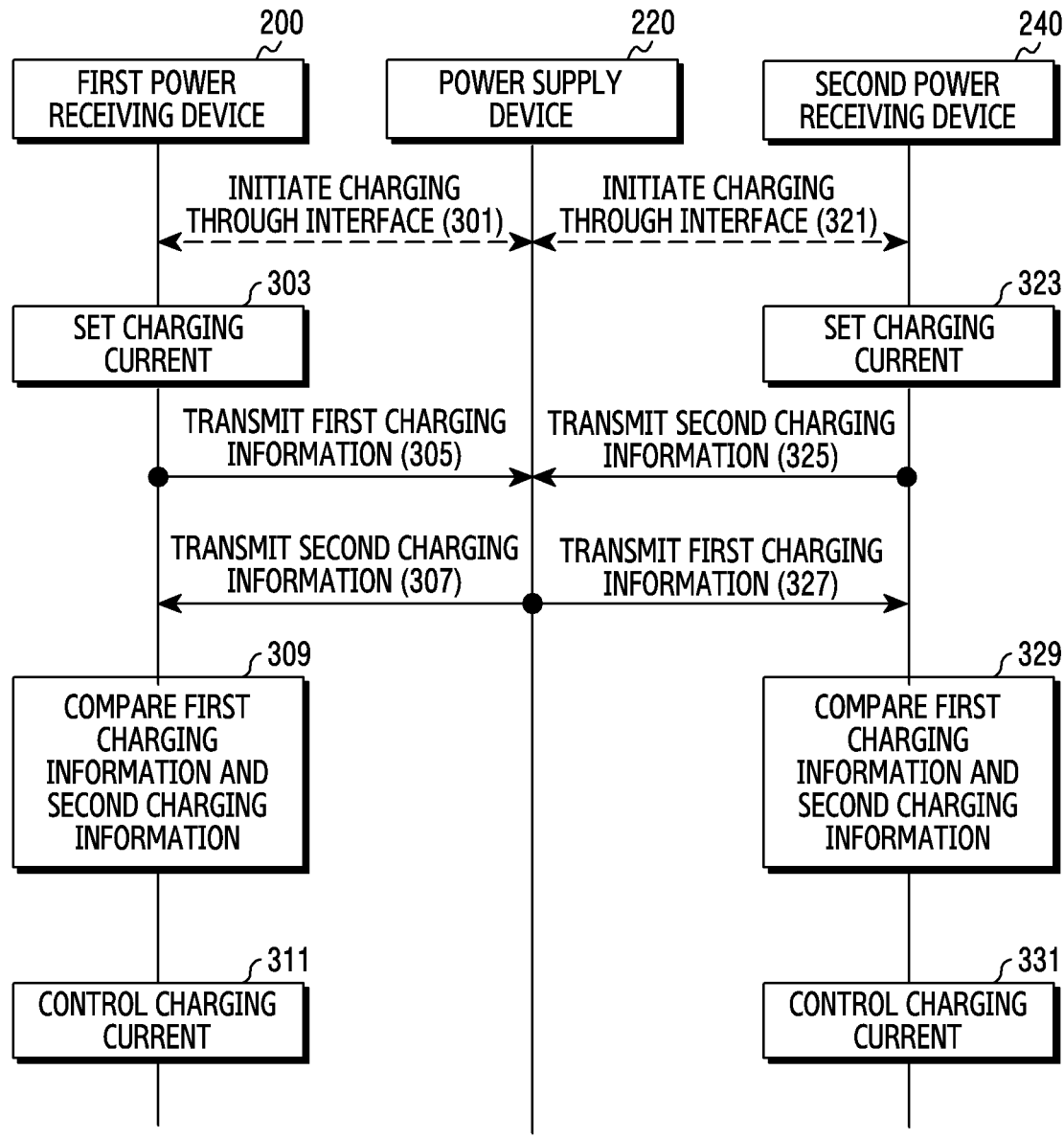
FIG. 3 illustrates a charging control flowchart of a first power receiving device according to an embodiment.

FIG. 3 illustrates a charging control flowchart of a first power receiving device according to an embodiment.

Referring to FIG. 3, the first power receiving device 200 may initiate the charging through an interface (e.g., the interface 112 of FIG. 2) when connected to the power supply device 220 in operation 301. For example, if the interface of the first power receiving device 200 is connected with an interface (e.g., the first interface 106 of FIG. 2) of the power supply device 220 having a pogo pin, the first power receiving device 200 may receive the power from the power supply device 220. The first power receiving device 200 may initiate charging a battery (e.g., the battery 206 of FIG. 2) with the received power from the power supply device 220.

In an embodiment, the first power receiving device 200 may set a charging current in operation 303. In an embodiment, the first power receiving device 200 may set the charging current to a designated current value corresponding to the charging initiation. The designated current value may be set by the user or be arbitrarily set by the manufacturer. For example, the first power receiving device 200 may initially set the charging current to 70 mA. In another embodiment, the first power receiving device 200 may set the charging current based on the remaining battery capacity information of the first power receiving device 200 and/or the charging information of the power supply device 220. For example, the first power receiving device 200 may set the charging current based on the remaining battery capacity information of the first power receiving device 200 when charging is initiated. If the remaining battery capacity of the first power receiving device 200 at the charging initiation corresponds to 70%, the first power receiving device 200 may set the charging current to 100 mA corresponding to the remaining battery capacity 70%. In yet another embodiment, the first power receiving device 200 may initially set the charging current to a maximum charging current of the battery 206.

In an embodiment, the first power receiving device 200 may transmit first charging information to the power supply device 220 in operation 305. In an embodiment, the first charging information may include at least one of the remaining battery capacity information, temperature information, battery voltage range information (or a battery voltage value) or battery full charging information of the first power receiving device 200. For example, the first charging information may include the remaining battery capacity (e.g., 65%) right after the charging of the first power receiving device 200 is initiated. In another example, the first charging information may include the temperature information indicating a temperature state (e.g., normal state, low-temperature state or a high-temperature state) of the first power receiving device 200. In yet another example, the first charging information may include the battery voltage range information indicating the voltage ranges of the battery of the first power receiving device 200. In an embodiment, the first power receiving device 200 may transmit the first charging information to the power supply device 220 if a specific condition is satisfied. For example, the specific condition may be satisfied if the charging of the first power receiving device 200 is initiated, if a request for the first charging information is received from the power supply device 220, if information indicating that the second power receiving device 240 is mounted in the power supply device 220 is received from the power supply device 220, if the state of the first power receiving device 200 is changed (e.g., if the battery voltage range of the first power receiving device 200 is changed, or the temperature is changed) or if a specific period is reached. The first charging information may include the initial first charging information and the updated first charging information.

In an embodiment, the first power receiving device 200 may receive second charging information from the power supply device 220 in operation 307. In an embodiment, the second charging information may include at least one of the mounting information, the remaining battery capacity information, temperature information, battery voltage range information (or a battery voltage value) or battery full charging information of the second power receiving device 240. For example, the second charging information may include the remaining battery capacity (e.g., 40%) right after the charging of the second power receiving device 240 is initiated. In another example, the second charging information may include the temperature information indicating a temperature state (e.g., normal state, low-temperature state or high-temperature state) of the second power receiving device 240. In yet another example, the second charging information may include the battery voltage range information indicating the voltage ranges of the battery of the second power receiving device 240. In an embodiment, the first power receiving device 200 may receive battery ID information of the second power receiving device 240. The battery ID information may indicate the manufacturer and/or the type of the battery. For example, if the battery ID information of the first power receiving device 200 and the second power receiving device 240 is different, the first power receiving device 200 may adjust the second charging information received from the second power receiving device 240. In an embodiment, the second charging information may include at least one of the remaining battery capacity information and the charging state information of the power supply device 220. For example, the second charging information may include the remaining battery capacity (e.g., 85%) right after the charging of the power supply device 220 is initiated. In another example, the second charging information may include information of the charging state of the battery (e.g., the battery 226 of FIG. 2) of the power supply device 220. The charging states may be states when the battery 226 is charged via a wire from an external power supply, wirelessly charged from an external power supply, fast charged from an external power supply, or not being charged.

In an embodiment, the first power receiving device 200 may compare the first charging information and the second charging information in operation 309. For example, the first power receiving device 200 may compare the remaining battery capacity of the first power receiving device 200 in the first charging information with the remaining battery capacity of the second power receiving device 240 in the second charging information.

In an embodiment, the first power receiving device 200 may control the charging current based on the comparison result of the first charging information and the second charging information. For example, if the remaining battery capacity of the first power receiving device 200 in the first charging information is 65% and the remaining battery capacity of the second power receiving device 240 in the second charging information is 40%, the first power receiving device 200 may lower the charging current set in operation 303. In another embodiment, if receiving information including the charging state of the battery 226 of the power supply device 220 from the power supply device 220, the first power receiving device 200 may control the charging current. For example, if information indicating that the battery 226 of the power supply device 220 is charging (e.g., wired charging, wireless charging or fast charging) from the power supply device 220, the first power receiving device 200 may change the charging current to the maximum charging current (e.g., 140 mA).

In an embodiment, the first power receiving device 200 may receive the second charging information from the power supply device 220, compare the first charging information and the second charging information, and request the power supply device 220 to transmit a designated power based on the comparison result. For example, the designated power transmission may be based on the difference of the remaining battery capacity of the first power receiving device 200 and the remaining battery capacity of the second power receiving device 240. In another example, the designated power transmission may be based on the battery voltage range information of the first power receiving device 200 and the battery voltage range information of the second power receiving device 240. In an embodiment, if the remaining battery capacity of the first power receiving device 200 is lower than the remaining battery capacity of the second power receiving device 240, the first power receiving device 200 may first request the designated power transmission from the power supply device 220.

The explanations on operation 321 through operation 331 of the second power receiving device 240 may correspond to operation 301 through operation 311 of the first power receiving device 200 in FIG. 3. Hence, descriptions corresponding, identical, or similar to the aforementioned explanations shall be omitted.

In an embodiment, the second power receiving device 240 may initiate charging through an interface when connected to the power supply device 220 in operation 321. Operation 321 of the second power receiving device 240 may be performed in parallel with operation 301 of the first power receiving device 200. In an embodiment, the second power receiving device 240 may set the charging current in operation 323. In an embodiment, the second power receiving device 240 may transmit the second charging information in operation 325. In an embodiment, the second charging information may include at least one of the remaining battery capacity information, the battery voltage range information (or the battery voltage value) or the battery full charging information of the second power receiving device 240. In an embodiment, the second power receiving device 240 may receive the first charging information from the power supply device 220. In an embodiment, the first charging information may include at least one of the mounting information, the remaining battery capacity information, the temperature information, the battery voltage range information (or the battery voltage value) or the battery full charging information of the first power receiving device 200. In an embodiment, the second power receiving device 240 may compare the first charging information and the second charging information in operation 329. In an embodiment, the second power receiving device 240 may control the charging current based on the comparison result of the first charging information and the second charging information in operation 331.

Figure 4A:
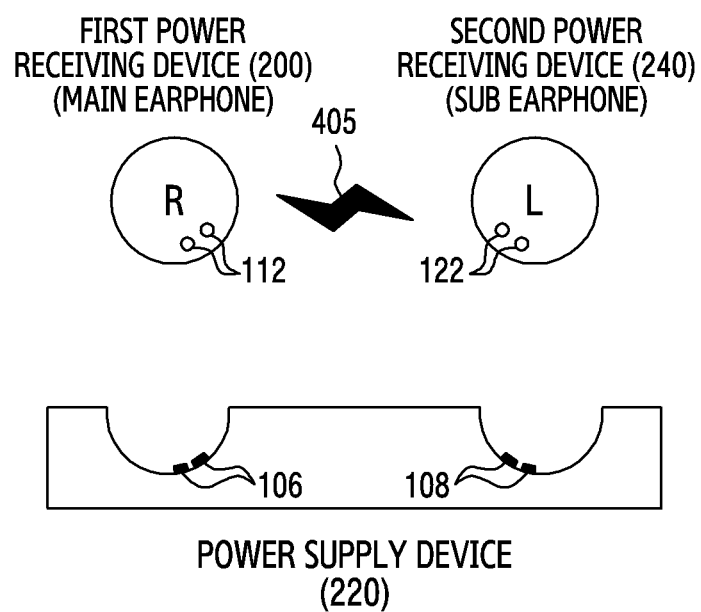
FIG. 4A illustrates that a first power receiving device and a second power receiving device are not mounted in a power supply device according to an embodiment.
Figure 4B:
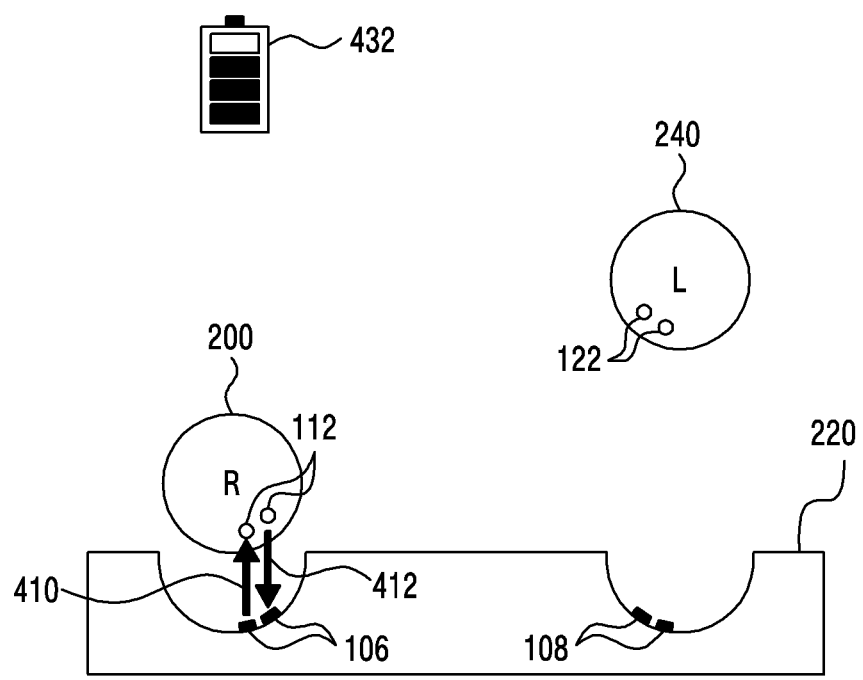
FIG. 4B illustrates that only the first power receiving device is mounted in the power supply device according to an embodiment.
Figure 4C:
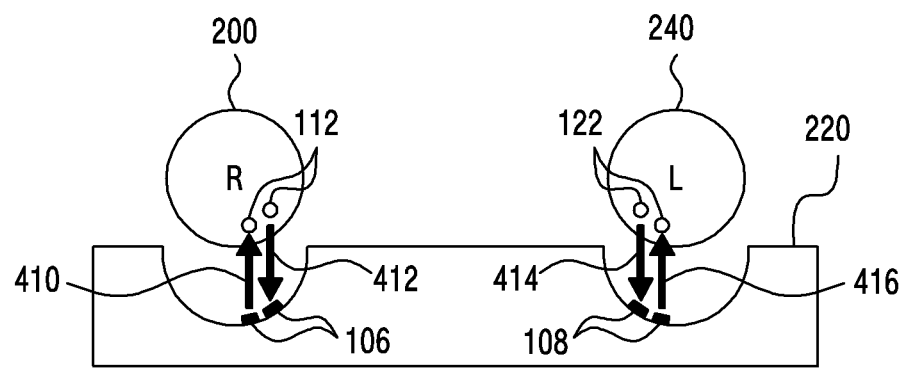
FIG. 4C illustrates that the first power receiving device and the second power receiving device are mounted in the power supply device according to an embodiment.

FIGS. 4A, 4B, and 4C illustrate connection states between a first power receiving device, a second power receiving device, and a power supply device according to an embodiment. Descriptions corresponding, identical, or similar to the aforementioned explanations shall be omitted in the descriptions for FIGS. 4A, 4B, and 4C.

FIG. 4A illustrates that the first power receiving device 200 and the second power receiving device 240 are not mounted in the power supply device 220 according to an embodiment.

Referring to FIG. 4A, the interface 112 of the first power receiving device 200 may be disposed in an area corresponding to the first interface 106 of the power supply device 220. In an embodiment, the interface 122 of the second power receiving device 240 may be disposed in an area corresponding to the second interface 108 of the power supply device 220.

In an embodiment, the first power receiving device 200 may be a main earphone, and the second power receiving device 240 may be a sub earphone. The main earphone may transmit and receive data to and from the terminal by connecting directly communication with the terminal (e.g., a smart phone), and the sub earphone may receive the data transmitted and received between the main earphone and the terminal by monitoring the communication connection of the main earphone and the terminal. In an embodiment, the roles (or settings) of the main earphone and the sub earphone of the first power receiving device 200 and the second power receiving device 240 may be changed based on a designated condition. For example, if the first power receiving device 200 and the second power receiving device 240 are detached from the power supply device 220 at the same time, the first power receiving device 200 which is worn on the right (R) side may correspond to the main earphone, and the second power receiving device 240 which is worn on the left (L) side may correspond to the sub earphone. In another example, if only the second power receiving device 240 is taken out of the power supply device 220, the second power receiving device 240 may be the main earphone. Alternatively, the roles of the main earphone and the sub earphone of the first power receiving device 200 and the second power receiving device 240 may be fixed. For example, the roles of the main earphone and the sub earphone of the first power receiving device 200 and the second power receiving device 240 may be designated by the devices' manufacturer, and then may not be changed. In an embodiment, if the first power receiving device 200 and the second power receiving device 240 are not mounted in the power supply device 220, wireless communication 405 may be performed between the first power receiving device 200 and the second power receiving device 240. For example, the first power receiving device 200 may receive the remaining battery capacity information of the second power receiving device 240 through Bluetooth communication with the second power receiving device 240. In another example, the first power receiving device 200 and the second power receiving device 240 may synchronize data received from the terminal using the Bluetooth communication.

In another embodiment, the power supply device 220 may perform wireless charging of the first power receiving device 200 and the second power receiving device 240. In an embodiment, the first power receiving device 200 may wirelessly receive charging information from the power supply device 220. For example, if the first power receiving device 200 and the second power receiving device 240 each include a wireless power interface such as coil antennas, the first power receiving device 200 may receive from the power supply device 220 information including the remaining battery capacity of the second power receiving device 240 and/or the remaining battery capacity of the power supply device 220 through the wireless power interface while being wirelessly charged by the power supply device 220.

FIG. 4B illustrates that only the first power receiving device is mounted in the power supply device according to an embodiment.

Referring to FIG. 4B, the interface 112 of the first power receiving device 200 and the first interface 106 of the power supply device 220 are electrically connected, and the first power receiving device 200 may initiate the charging. The first power receiving device 200 may receive the power through the interface 112. In an embodiment, the first power receiving device 200 may transmit the charging information 412 including a remaining battery capacity 432 to the power supply device 220 through the interface 112. For example, the first power receiving device 200 may transmit the charging information 412 including the remaining battery capacity 432 corresponding to 75% at the initial charging to the power supply device 220. In an embodiment, the first power receiving device 200 may transmit the charging information 412 updated at specific intervals to the power supply device 220. Alternatively, the first power receiving device 200 may transmit updated charging information 412 when a specific event occurs. For example, the first power receiving device 200 may transmit the charging information 412 if the battery voltage range is changed, or if the temperature is changed.

In an embodiment, the power supply device 220 may detect whether the power receiving devices 200 and 240 are mounted, through the first interface 106 and the second interface 108. For example, if at least one port of the second interface 108 performs the detect port function, and the resistance value does not change at the second interface 108, the power supply device 220 may determine that the second power receiving device 240 is not mounted.

In an embodiment, the first power receiving device 200 may receive charging information 410 from the power supply device 220 through the interface 112. For example, if the second power receiving device 240 is not mounted in the power supply device 220, as shown in FIG. 4B, the first power receiving device 200 may receive the charging information 410 including only the remaining battery capacity of the power supply device 220. In another example, the first power receiving device 200 may receive the charging information 410 indicating that the second power receiving device 240 is not mounted, from the power supply device 220.

FIG. 4C illustrates that the first power receiving device and the second power receiving device are mounted in the power supply device according to an embodiment.

Referring to FIG. 4C, the second power receiving device 240 may be mounted in the power supply device 220 to which the first power receiving device 200 is already mounted. In an embodiment, the first power receiving device 200 and the second power receiving device 240 may conduct power line communication (PLC) through the power supply device 220. In an embodiment, the first power receiving device 200 may transmit and receive data by performing Bluetooth pairing with the second power receiving device 240.

In an embodiment, the interface 122 of the second power receiving device 240 and the second interface 108 of the power supply device 220 are electrically connected, the second power receiving device 240 may initiate charging. The second power receiving device 240 may receive the power through the interface 122. In an embodiment, the second power receiving device 240 may transmit charging information 414 including a remaining battery capacity 434 to the power supply device 220 through the interface 122. For example, the second power receiving device 240 may transmit the charging information 414 including the remaining battery capacity 434 corresponding to 25% at initial charging to the power supply device 220.

In an embodiment, the power supply device 220 may transmit the charging information 416 received from the first power receiving device 200 and/or the charging information 416 of the power supply device 220 to the second power receiving device 240. In an embodiment, the power supply device 220 may transmit the charging information 410 received from the second power receiving device 240 to the first power receiving device 200. For example, the power supply device 220 may transmit the charging information 416 including the remaining battery capacity corresponding to 75% of the first power receiving device 200 to the second power receiving device 240, and transmit the charging information 410 including the remaining battery capacity corresponding to 25% of the second power receiving device 240 to the first power receiving device 200.

In another embodiment, if the remaining battery capacity of the power supply device 220 falls below a reference value, the first power receiving device 200 and the second power receiving device 240 may control their respective charging currents. For example, the first power receiving device 200 of the remaining battery capacity 75% may receive from the power supply device 220 charging information including the remaining battery capacity 25% of the second power receiving device 240 and the remaining battery capacity 20% of the power supply device 220. The second power receiving device 240 may receive from the power supply device 220 charging information including the remaining battery capacity 75% of the first power receiving device 200 and the remaining battery capacity 20% of the power supply device 220. The first power receiving device 200 and the second power receiving device 240 may determine that the remaining battery capacity of the power supply device 220 is below the reference value (e.g., 25%). The first power receiving device 200 may stop charging, and the second power receiving device 240 may set the charging current to the maximum charging current value.

Figure 5:
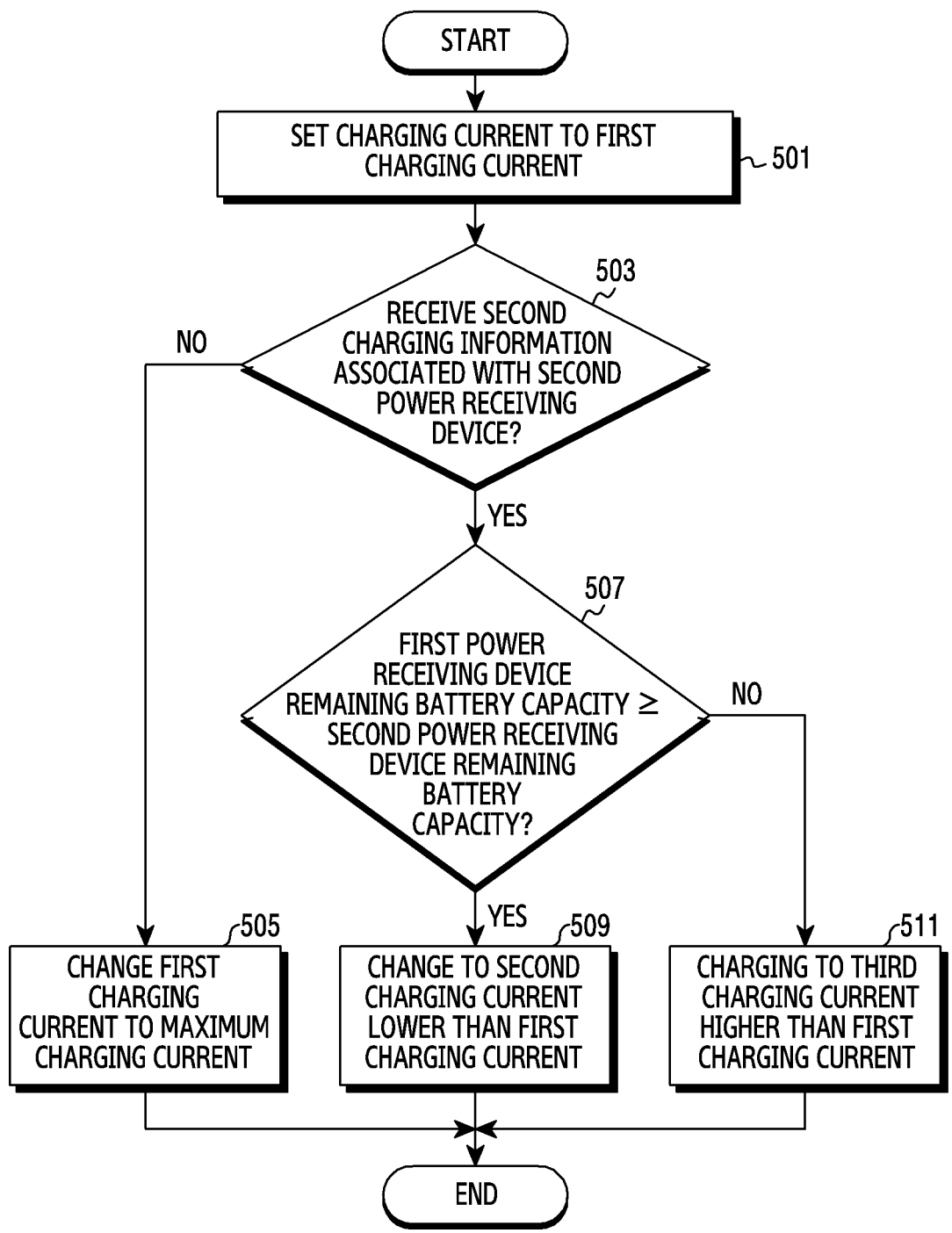
FIG. 5 illustrates a flowchart of a first power receiving device for changing a charging current based on information of a second power receiving device according to an embodiment.

FIG. 5 illustrates a flowchart of a first power receiving device for changing a charging current based on information of a second power receiving device according to an embodiment.

Referring to FIG. 5, the first power receiving device (e.g., the first power receiving device 200 of FIG. 2) may set the charging current to a first charging current in operation 501. For example, the first power receiving device 200 may set the charging current to a designated current value (e.g., 70 mA) for initial charging.

In an embodiment, the first power receiving device 200 may determine whether it receives second charging information associated with the second power receiving device (e.g., the second power receiving device 240 of FIG. 2) from a power supply device (e.g., the power supply device 220 of FIG. 2) in operation 503. The second charging information may include the remaining battery capacity of the second power receiving device 240. In an embodiment, if the second charging information is not received, the first power receiving device 200 may set the first charging current to the maximum charging current in operation 505. For example, if the second charging information including the remaining battery capacity of the second power receiving device 240 is not received, the first power receiving device 200 may determine that the second power receiving device 240 is not mounted in the power supply device 220. The first power receiving device 200 may change the charging current which is set to the first charting current (e.g., 70 mA) to the maximum charging current (e.g., 140 mA) of the battery (e.g., the battery 206 of FIG. 2).

In an embodiment, if the second charging information is received, the first power receiving device 200 may compare the remaining battery capacity of the first power receiving device 200 with the remaining battery capacity of the second power receiving device 240 in operation 5070. In an embodiment, if the remaining battery capacity of the first power receiving device 200 is greater than or equal to the remaining battery capacity of the second power receiving device 240, the first power receiving device 200 may change the charging current to the second charging current which is lower than the first charging current in operation 509. In an embodiment, if the remaining battery capacity of the first power receiving device 200 is smaller than the remaining battery capacity of the second power receiving device 240, the first power receiving device 200 may change the charging current to a third charging current which is higher than the first charging current in operation 511. For example, if the remaining battery capacity of the first power receiving device 200 is 70% and the remaining battery capacity of the second power receiving device 240 is 65%, the first power receiving device 200 may change the charging current to 30 mA which is lower than the first charging current 70 mA. In another example, if the remaining battery capacity of the first power receiving device 200 is 70% and the remaining battery capacity of the second power receiving device 240 is 85%, the first power receiving device 200 may change the charging current to 120 mA which is higher than the first charging current 70 mA. In another embodiment, even if the remaining battery capacity of the first power receiving device 200 is lower than the remaining battery capacity of the second power receiving device 240, the first power receiving device 200 may maintain the first charging current which is the initially-set charging current.

In an embodiment, the first power receiving device 200 may set the first charging current to the maximum charging current (e.g., 140 mA) in operation 501. If the second charging information associated with the second power receiving device 240 from the power supply device 220 is not received, the first power receiving device 200 may maintain the first charging current. If the second charging information from the power supply device 220 is received, the first power receiving device 200 may compare the remaining battery capacity of the first power receiving device 200 and the remaining battery capacity of the second power receiving device 240 in operation 507. The first power receiving device 200 may change the charging current based on the remaining battery capacity difference. For example, if the remaining battery capacity of the first power receiving device 200 is greater than the remaining battery capacity of the second power receiving device 240 and the remaining battery capacity difference exceeds a reference value, the first power receiving device 200 may change to the second charging current (e.g., 30 mA). If the remaining battery capacity of the first power receiving device 200 is greater than the remaining battery capacity of the second power receiving device 240 and the remaining battery capacity difference falls below the reference value, the first power receiving device 200 may change to the third charging current (e.g., 70 mA). Alternatively, if the remaining battery capacity of the first power receiving device 200 is smaller than the remaining battery capacity of the second power receiving device 240 and the remaining battery capacity difference falls below the reference value, the first power receiving device 200 may change to the third charging current (e.g., 70 mA). If the remaining battery capacity of the first power receiving device 200 is smaller than the remaining battery capacity of the second power receiving device 240 and the remaining battery capacity difference exceeds the reference value, the first power receiving device 200 may change to a fourth charging current (e.g., 100 mA).

In an embodiment, if the first power receiving device 200 is completely charged before the second power receiving device 240, the second power receiving device 240 may change the charging current to the maximum charging current at the charging completion of the first power receiving device 200.

In another embodiment, if the remaining battery capacity of the first power receiving device 200 is equal to the remaining battery capacity of the second power receiving device 240, the first power receiving device 200 may maintain the charging current with the first charging current. For example, when setting the charging current in operation 501, the first power receiving device 200 may set the current (e.g., 70 mA) at half of the maximum charging current (e.g., 140 mA) of the battery 206. If each of the remaining battery capacity of the first power receiving device 200 and the remaining battery capacity of the second power receiving device 240 is equal to 70%, the first power receiving device 200 may maintain the first charging current 70 mA which is initially set. In an embodiment, if the first power receiving device 200 and the second power receiving device 240 are mounted in the power supply device 220, the second power receiving device 240 may also perform operation 501 through operation 511 of FIG. 5. For example, the second power receiving device 240 may set the initial charging current to the first charging current, and determine whether the first charging information associated with the first power receiving device 200 is received from the power supply device 220. If the first charging information is not received, the second power receiving device 240 may determine that the first power receiving device 200 is not mounted in the power supply device 220. If the first charging information is received, the second power receiving device 240 may compare the remaining battery capacity of the first power receiving device 200 and the remaining battery capacity of the second power receiving device 240. If the remaining battery capacity of the second power receiving device 240 is greater than or equal to the remaining battery capacity of the first power receiving device 200, the second power receiving device 240 may change the charging current to the second charging current lower than the first charging current. If the remaining battery capacity of the second power receiving device 240 is smaller than the remaining battery capacity of the first power receiving device 200, the second power receiving device 240 may change the charging current to the third charging current which is higher than the first charging current.

The first power receiving device 200 and the second power receiving device 240 control the charging current based on the remaining battery capacity information in FIG. 5. The remaining battery capacity information is also known as state of charge (SOC) information. However, the power receiving device 200 and 240 may control the charging current based on the battery voltage in another embodiment. The battery SOC value of the power receiving device 200 and 240 may be substantially similar but not identical to the battery voltage value. The charging current control based on the battery voltage value is described in detail below in connection with FIG. 6.

Figure 6:
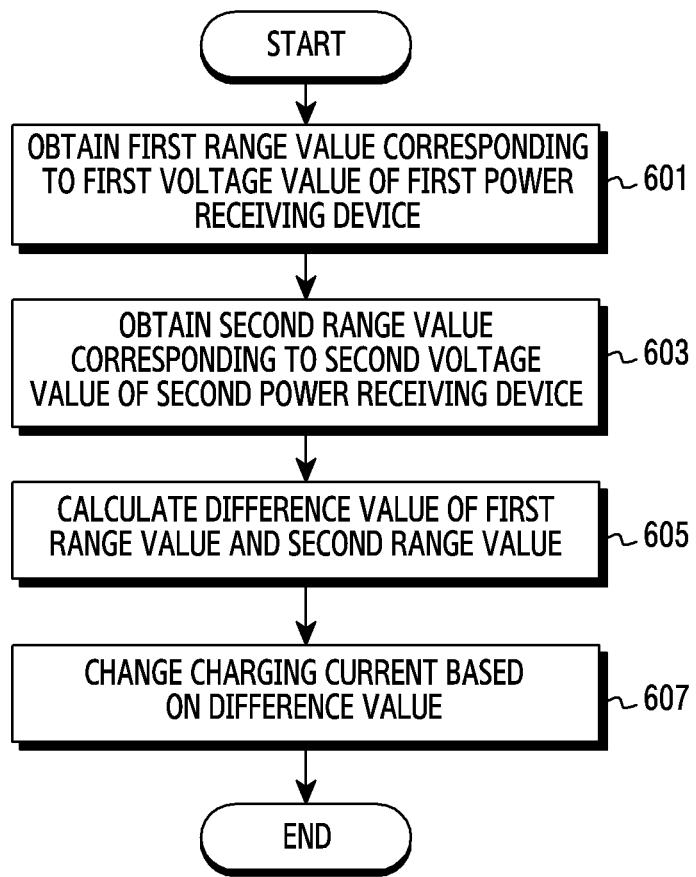
FIG. 6 illustrates a flowchart of changing a charging current based on a difference of battery voltage values of a first power receiving device and a second power receiving device according to an embodiment.

FIG. 6 illustrates a flowchart of changing a charging current based on a difference of battery voltage values of a first power receiving device and a second power receiving device according to an embodiment. For ease of description, the operating entity of FIG. 6 is the first power receiving device. But the operating entity may also be the second power receiving device.

Referring to FIG. 6, the first power receiving device (e.g., the first power receiving device 200 of FIG. 2) may obtain a first range value corresponding to a first voltage value of the first power receiving device 200 in operation 601. In an embodiment, the first power receiving device 200 may obtain a second range value corresponding to a second voltage value of the second power receiving device 240 in operation 603. The range values corresponding to the voltage values of the power receiving device 200 and 240 may set based on a preset table.

TABLE 1

| A battery voltage of power receiving device (V) | Range value |
|---|---|
| ~3.6 V | 0 |
| 3.6 V~3.8 V | 1 |
| 3.8 V~4.0 V | 2 |
| 4.0 V~ | 3 |

Table 1 sets the range values for the voltage ranges of the power receiving device 200 and 240. In an embodiment, the battery voltage range of the power receiving device 200 and 240 may include a plurality of voltage ranges. For example, the battery voltage range may include a first voltage range (e.g., the battery voltage<3.6 V), a second voltage range (e.g., 3.6 V≤the battery voltage<3.8 V), a third voltage range (e.g., 3.8 V≤ the battery voltage<4.0 V), and a fourth voltage range (e.g., the battery voltage≥4.0 V). The reference voltage value (e.g., 3.6 V, 3.8 V, 4.0 V) in the battery voltage range may be arbitrarily changed by the manufacturer or the user.

In an embodiment, the battery (e.g., the battery 206 of FIG. 2) of the first power receiving device 200 may correspond to the voltage value of 3.9 V. The first power receiving device 200 may detect the first range (e.g., the range including the voltage value of 3.8 V through 4.0 V) corresponding to the voltage value of 3.9 V among the plurality of the voltage ranges. For example, the first power receiving device 200 may obtain the first range value "2" designated for the first range.

Similarly, the battery of the second power receiving device 240 may correspond to the voltage value of 3.5 V. The first power receiving device 200 may detect the second range (e.g., the range including the voltage value below 3.6 V) corresponding to the voltage value of 3.5 V among the plurality of the voltage ranges. For example, the first power receiving device 200 may obtain the second range value "0" designated for the second range.

In an embodiment, the first power receiving device 200 may calculate a difference value of the first range value and the second range value in operation 605. In an embodiment, the first power receiving device 200 may change the charging current based on the difference value of the first range value and the second range value in operation 607. The charging current corresponding to the difference of the first range value and the second range value may be set based on a preset table.

TABLE 2

| The difference value of a first range value and a second range value | Changing currents of the first power receiving device | Charging currents of the second power receiving device |
| --- | --- | --- |
| individual charging of the first power receiving device | 140 mA | — |
| −3 | 100 mA | 40 mA |
| −2 | 100 mA | 40 mA |
| −1 | 70 mA | 70 mA |
| 0 | 70 mA | 70 mA |
| 1 | 70 mA | 70 mA |
| 2 | 40 mA | 100 mA |
| 3 | 40 mA | 100 mA |
| individual charging of the second power receiving device | — | 140 mA |

Table 2 presets the charging currents of the first power receiving device 200 and the second power receiving device 240 based on the differences of the first range value and the second range value. In an embodiment, if the first power receiving device 200 and the second power receiving device 240 are individually charged, the first power receiving device 200 and the second power receiving device 240 may set their charging currents to the maximum charging current value. For example, if only the first power receiving device 200 is mounted in the power supply device 220, the first power receiving device 200 may be charged with the maximum charging current value 140 mA.

In an embodiment, if the battery voltage of the first power receiving device 200 is 3.9 V and the battery voltage of the second power receiving device 240 is 3.5 V, the first power receiving device 200 may obtain the difference value "2" of the first range value "2" and the second range value "0". The first power receiving device 200 may change the charging current to the preset current value "40 mA" corresponding to the difference value "2" of the first range value and the second range value.

In another embodiment, if the battery voltage of the first power receiving device 200 is 3.5 V and the battery voltage of the second power receiving device 240 is 3.9 V, the first power receiving device 200 may obtain the difference value "−2" of the first range value "0" and the second range value "2". The first power receiving device 200 may change the charging current to the preset current value "100 mA" corresponding to the difference value "−2" of the first range value and the second range value. If the battery voltage of the first power receiving device 200 or the second power receiving device 240 corresponds to a low voltage (e.g., 2.8 V), the first power receiving device 200 or the second power receiving device 240 may not use Table 1 and Table 2 or the operations shown in FIG. 6.

In yet another embodiment, if the difference of the battery voltage of the first power receiving device 200 and the battery voltage of the second power receiving device 240 exceeds a reference value (e.g., 1 V), the first power receiving device 200 may be charged with the maximum charging current value 140 mA. For example, if the battery voltage of the first power receiving device 200 is 3.0 V and the battery voltage of the second power receiving device 240 is 4.1 V, the first power receiving device 200 may determine that the second power receiving device 240 is not mounted in the power supply device 220. The first power receiving device 200 may set the charging current to the maximum charging current value, in the same manner as the standalone charging. The second power receiving device 240 may not perform charging until the battery voltage difference of the first power receiving device 200 and the second power receiving device 240 reaches the reference value (e.g., 1 V).

In an embodiment, the power receiving device (e.g., the first power receiving device 200 or the second power receiving device 240 of FIG. 2) may store the data of Table 1 which presents the preset range values for the voltage ranges, in a memory (e.g., the memory 212 of FIG. 2). The power receiving device 200 and 240 may store the data of Table 2 which presents the preset charging current values for the differences of the battery voltage range values of the power receiving devices 200 and 240, in the memory 212.

Figure 7:
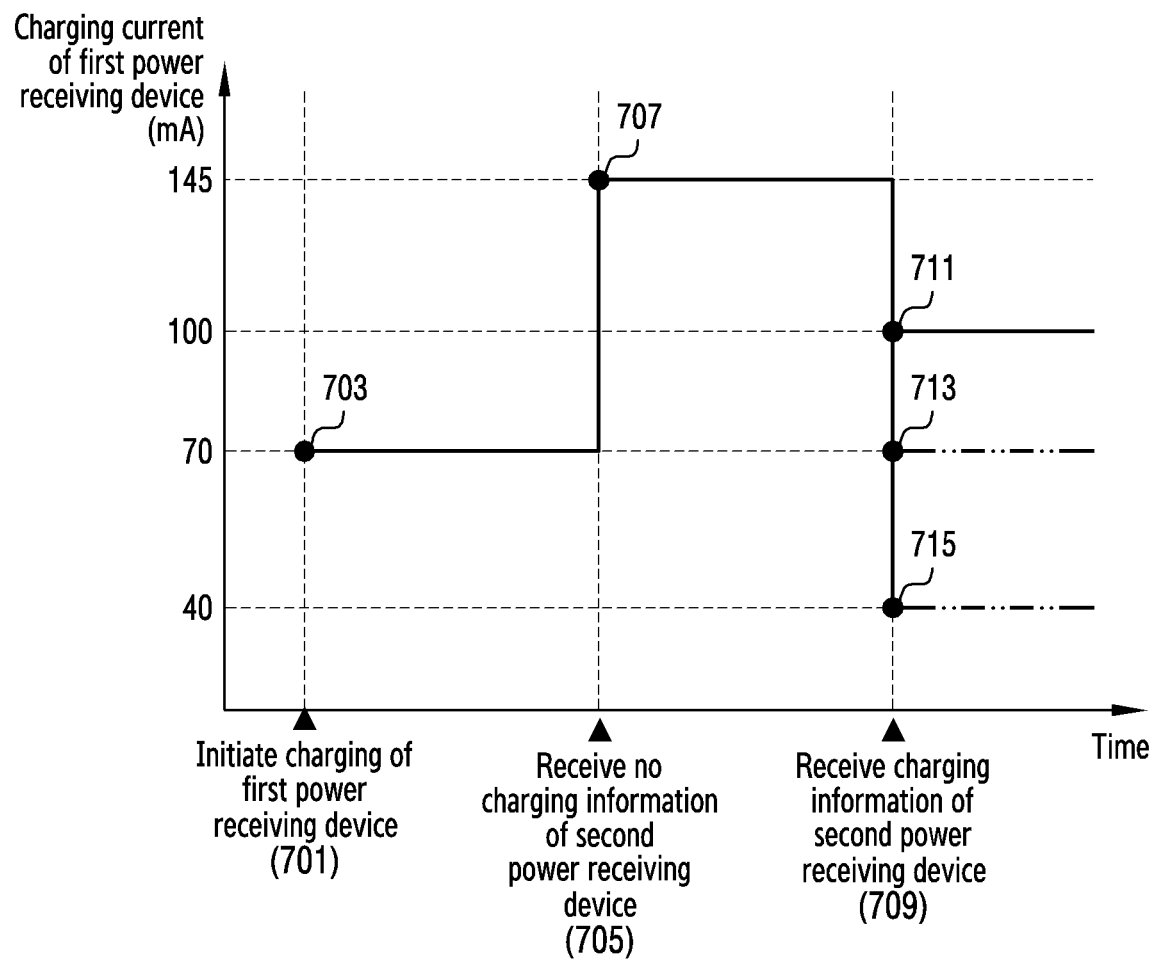
FIG. 7 illustrates a charging current graph of a first power receiving device based on whether charging information of a second power receiving device is received according to an embodiment.

FIG. 7 illustrates a charging current graph of a first power receiving device based on whether charging information of a second power receiving device is received according to an embodiment.

Referring to FIG. 7, the first power receiving device (e.g., the first power receiving device 200 of FIG. 2) may be connected with a power supply device (e.g., the power supply device 220 of FIG. 2) and initiate charging 701. For example, the first power receiving device 200 is mounted in the power supply device 220 and may set the charging current to an initial charging current value 703 of 70 mA. In an embodiment, if charging information of the second power receiving device (e.g., the second power receiving device 240 of FIG. 2) is not received within a specific time at 705, the first power receiving device 200 may change the charging current to a maximum charging current value 707 of 140 mA. For example, the first power receiving device 200 may maintain charging with the initial charging current value 703, and determine whether the charging information of the second power receiving device 240 is received after five seconds. If the charging information of the second power receiving device 240 is not received at five seconds, the first power receiving device 200 may change the charging current to the maximum charging current value.

In an embodiment, the first power receiving device 200 may receive the charging information of the second power receiving device 240 while charging with the maximum charging current value. If the charging information of the second power receiving device 240 is received at 709, the first power receiving device 200 may change the charging current based on a voltage value difference. For example, if the voltage range difference between the first power receiving device 200 and the second power receiving device 240 is "−3" or "−2", the first power receiving device 200 may change the charging current to 100 mA 711. In another example, if the voltage range difference between the first power receiving device 200 and the second power receiving device 240 is "−1", "0" or "1", the first power receiving device 200 may change the charging current to 70 mA 713. In yet another example, if the voltage range difference between the first power receiving device 200 and the second power receiving device 240 is "2" or "3", the first power receiving device 200 may change the charging current to 40 mA 715.

The power receiving device and the method in certain embodiments of the instant disclosure may control a charging current by receiving remaining battery capacity information of a paired power receiving device, and thus achieve balanced charging with the paired power receiving device.

It should be appreciated that various embodiments of the disclosure and the terms used therein are not intended to limit the technological features set forth in the disclosure to particular embodiments, and include various changes, equivalents, or replacements of a corresponding embodiment. With regard to the descriptions of the drawings, similar reference numerals may be used for similar or related elements. Singular form of a noun corresponding to an item may include one or more items, unless the relevant context clearly indicates otherwise. In this disclosure, expressions such as "have", "may have", "comprise" or "may comprise" refer to presence of a corresponding feature (e.g., numerical, functional, operational, or component such as a component), and do not exclude presence of an additional feature. In this disclosure, phrases such as "A or B", "at least one of A and B", "at least one of A or B", "A, B, or C", "at least one of A, B, and C", and "at least one of A, B, or C" may include all possible combinations of the items enumerated together in a corresponding one of the phrases. Terms such as "1st" and "2nd", or "first" or "second" may be used to simply distinguish a corresponding component from another corresponding component, and does not limit the corresponding components in other aspect (e.g., importance or order). If an element (e.g., a first element) is referred to, with or without the term "operatively" or "communicatively", as "coupled with" or "connected with" another element (e.g., a second element), it means that the element may be coupled with the other element directly (e.g., wiredly), wirelessly, or via a third element.

The term "module" used in the disclosure includes a unit configured in hardware, software, or firmware, and may interchangeably be used with a term, for example, logic, logic block, part, or circuit. A module may be a single integral part or a minimum unit or part for performing one or more functions. For example, according to an embodiment, the module may be configured in the form of an application-specific integrated circuit (ASIC).

Various embodiments of the disclosure may be implemented as software (e.g., a program) including instructions stored in machine (e.g., computer-readable storage media) stored in a memory (e.g., an internal memory or an external memory). A processor (e.g., the processor) of the machine (e.g., an electronic device) may invoke and execute at least one of commands stored in the storage medium. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Herein, the term 'non-transitory' simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In this case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the present disclosure has been shown and described with reference to various embodiments thereof, it will be understood by those skilled in the art that various changes in form and details may be made therein without departing from the present disclosure as defined by the appended claims and their equivalents.

What is claimed is:

1. A first power receiving device comprising:
   a housing;
   a battery disposed in the housing;
   a power management integrated circuit operatively connected with the battery;
   an interface for receiving power from a power supply device; and
   a processor electrically connected with the battery, the power management integrated circuit and the interface, and configured to control a charging current using the power management integrated circuit,
   wherein the processor is further configured to:
   receive, from a second power receiving device paired with the first power receiving device, information associated with a level of a battery in the second power receiving device, through the power supply device,
   control the charging current based on a comparing a level of the battery in the first power receiving device with the information associated with the level of the battery in the second power receiving device, and
   transmit information associated with the level of the battery in the first power receiving device to the power supply device, such that the second power receiving device receives the information associated with the level of the battery in the first power receiving device through the power supply device and controls a charging current of the second power receiving device based on a comparing the level of the battery in the second power receiving device with the information associated with the level of the battery in the first power receiving device.

2. The first power receiving device of claim 1, wherein the processor is further configured to:
if charging from the power supply device is detected, set the charging current to a first charging current,
in comparing the level of the battery in the first power receiving device and the level of the battery in the second power receiving device, if the level of the battery in the first power receiving device is higher than or equal to the level of the battery in the second power receiving device, change the charging current to a second charging current which is lower than the first charging current, and
in comparing the level of the battery in the first power receiving device and the level of the battery in the second power receiving device, if the level of the battery in the first power receiving device is lower than the level of the battery in the second power receiving device, change the charging current to a third charging current which is higher than the first charging current.

3. The first power receiving device of claim 1, wherein the processor is further configured to:
if the level of the battery in the second power receiving device is not received, set the charging current to a maximum charging current.

4. The first power receiving device of claim 1, wherein the information associated with the level of the battery in the first power receiving device comprises a first voltage value indicating a battery voltage of the first power receiving device, and the information associated with the level of the battery in the second power receiving device comprises a second voltage value indicating a battery voltage of the second power receiving device, and
the processor is further configured to control the charging current based on the first voltage value and the second voltage value.

5. The first power receiving device of claim 4, wherein the processor is further configured to:
obtain a first range value corresponding to the first voltage value among a plurality of voltage ranges related to the charging,
obtain a second range value corresponding to the second voltage value among the plurality of the voltage ranges, and
control the charging current based on a difference of the first range value and the second range value.

6. The first power receiving device of claim 1, wherein the information associated with the level of the battery in the first power receiving device transmitted to the power supply device comprises remaining battery capacity information, temperature information, a battery voltage, battery voltage range information and/or battery full charging information of the first power receiving device.

7. The first power receiving device of claim 1, wherein the processor is further configured to:
if a designated condition is satisfied, transmit the information associated with the level of the battery in the first power receiving device to the power supply device.

8. The first power receiving device of claim 7, wherein the designated condition comprises detecting electrical connection with the power supply device through the interface.

9. The first power receiving device of claim 7, wherein the designated condition comprises a change of a state of charge (SOC) value of the battery of the first power receiving device.

10. The first power receiving device of claim 1, wherein the information associated with the level of the battery in the second power receiving device received from the power supply device comprises remaining battery capacity information and/or SOC information of the power supply device.

11. An operating method of a first power receiving device, comprising:
receiving, from a second power receiving device paired with the first power receiving device, information associated with a level of a battery in the second power receiving device, through a power supply device,
controlling a charging current based on a comparing a level of the battery in the first power receiving device with the information associated with the level of the battery in the second power receiving device, and
transmitting information associated with the level of the battery in the first power receiving device to the power supply device, such that the second power receiving device receives the information associated with the level of the battery in the first power receiving device through the power supply device and controls a charging current of the second power receiving device based on a comparing the level of the battery in the second power receiving device with the information associated with the level of the battery in the first power receiving device.

12. The operating method of claim 11, further comprising:
when charging from the power supply device is detected, setting the charging current to a first charging current;
in comparing level of the battery in the first power receiving device and the level of the battery in the second power receiving device, when the level of the battery in the first power receiving device is higher than or equal to the level of the battery in the second power receiving device, changing the charging current to a second charging current which is lower than the first charging current; and
in comparing the level of the battery in the first power receiving device and the level of the battery in the second power receiving device, when the level of the battery in the first power receiving device is lower than the level of the battery in the second power receiving device, changing the charging current to a third charging current which is higher than the first charging current.

13. The operating method of claim 11, wherein the information associated with the level of the battery in the first power receiving device comprises a first voltage value indicating a battery voltage of the first power receiving device, and the information associated with the level of the battery in the second power receiving device comprises a second voltage value indicating a battery voltage of the second power receiving device, and further comprising:
controlling the charging current based on the first voltage value and the second voltage value.

14. The operating method of claim 13, further comprising:
obtaining a first range value corresponding to the first voltage value among a plurality of voltage ranges related to the charging;
obtaining a second range value corresponding to the second voltage value among the plurality of the voltage ranges; and controlling the charging current based on a difference of the first range value and the second range value.

15. The operating method of claim 11, further comprising:
when the level of the battery in the second power receiving device is not received, setting the charging current to a maximum charging current.

* * * * *